US012771090B2

(12) United States Patent
Budnicki

(10) Patent No.: US 12,771,090 B2
(45) Date of Patent: Oct. 20, 2026

(54) LASER SYSTEMS AND METHODS FOR PROVIDING HIGH-FREQUENCY AND LOW-FREQUENCY LASER PULSE TRAINS

(71) Applicant: TRUMPF LASER GMBH, Schramberg (DE)

(72) Inventor: Aleksander Budnicki, Gundelfingen (DE)

(73) Assignee: TRUMPF LASER GMBH, Schramberg (DE)

( * ) Notice: Subject to any disclaimer, the term of this patent is extended or adjusted under 35 U.S.C. 154(b) by 1106 days.

(21) Appl. No.: 17/344,076

(22) Filed: Jun. 10, 2021

(65) Prior Publication Data

US 2021/0305768 A1 Sep. 30, 2021

Related U.S. Application Data

(63) Continuation of application No. PCT/EP2019/083914, filed on Dec. 5, 2019.

(30) Foreign Application Priority Data

Dec. 10, 2018 (DE) ........................ 102018221363.1

(51) Int. Cl.
*H01S 3/10* (2006.01)
*H01S 3/00* (2006.01)
(Continued)

(52) U.S. Cl.
CPC ...... *H01S 3/10046* (2013.01); *G02F 2203/54* (2013.01); *H01S 3/0057* (2013.01);
(Continued)

(58) Field of Classification Search
CPC .. H01S 3/10046; H01S 3/0057; H01S 3/0085; H01S 3/06758; H01S 3/23;
(Continued)

(56) References Cited

U.S. PATENT DOCUMENTS 9,166,355 B2 10/2015 Messerly et al.
10,859,888 B2 * 12/2020 Royon ................. H01S 3/2375
(Continued)

FOREIGN PATENT DOCUMENTS

CN 102771020 A 11/2012
CN 104362500 A 2/2015
(Continued)

OTHER PUBLICATIONS

CN Office Action in Chinese Appln. No. 201980081796.9, mailed on Aug. 31, 2023, 9 pages (with English translation).
(Continued)

*Primary Examiner* — M. A. Golub-Miller
(74) *Attorney, Agent, or Firm* — Fish & Richardson P.C.

(57) ABSTRACT

Laser systems are described that each include at least one excitation laser, a high frequency laser pulse source, and a beam switchover device. The beam switchover device is configured to be switched, in order a) in a high-frequency functional position to guide at least one GHz laser pulse train with a pulse repetition rate of individual pulses in the GHz laser pulse train of at least 0.5 GHz from the high frequency laser pulse source to a target position, and b) in a low-frequency functional position to guide at least one low-frequency laser pulse train with a pulse repetition rate of individual pulses in the low-frequency laser pulse train of less than 0.5 GHz from the at least one excitation laser to the target position.

14 Claims, 4 Drawing Sheets

(51) Int. Cl.
*H01S 3/067* (2006.01)
*H01S 3/23* (2006.01)
*H01S 5/00* (2006.01)
*H01S 5/50* (2006.01)

(52) U.S. Cl.
CPC ......... *H01S 3/0085* (2013.01); *H01S 3/06758* (2013.01); *H01S 3/23* (2013.01); *H01S 5/0057* (2013.01); *H01S 5/0085* (2013.01); *H01S 5/50* (2013.01); *H01S 2301/08* (2013.01)

(58) Field of Classification Search
CPC .. H01S 2301/08; H01S 5/0057; H01S 5/0085; H01S 5/50; G02F 2203/54
See application file for complete search history.

(56) References Cited

U.S. PATENT DOCUMENTS

| | | | | |
|---|---|---|---|---|
| 11,495,934 | B1 * | 11/2022 | Richardson | H01S 3/005 |
| 11,955,766 | B2 * | 4/2024 | Honninger | H01S 3/0057 |
| 2001/0010536 | A1 * | 8/2001 | Katzir | G03F 7/70041 359/305 |
| 2004/0240037 | A1 | 12/2004 | Harter | |
| 2009/0135859 | A1 * | 5/2009 | Yu | H01S 3/1109 372/18 |
| 2011/0141540 | A1 * | 6/2011 | Hochrein | G01N 21/636 359/238 |
| 2012/0242973 | A1 * | 9/2012 | Tunnermann | H01S 3/10046 372/10 |
| 2012/0275478 | A1 * | 11/2012 | Krausz | H01S 3/0057 372/25 |
| 2014/0153596 | A1 * | 6/2014 | Chuang | H01S 3/005 372/25 |
| 2014/0293404 | A1 * | 10/2014 | Pierrot | H01S 3/0057 359/345 |
| 2016/0285223 | A1 * | 9/2016 | Chuang | G02B 5/3083 |
| 2018/0309258 | A1 * | 10/2018 | Honninger | H01S 3/10015 |
| 2019/0036292 | A1 * | 1/2019 | Sutter | H01S 3/06754 |
| 2019/0148906 | A1 * | 5/2019 | Flaig | H01S 3/2308 372/25 |
| 2019/0235346 | A1 * | 8/2019 | Royon | H01S 5/06226 |
| 2022/0337017 | A1 * | 10/2022 | Michailovas | H01S 3/0057 |
| 2022/0385019 | A1 * | 12/2022 | Budnicki | H01S 3/0057 |
| 2024/0120698 | A1 * | 4/2024 | Royon | G02F 1/365 |

FOREIGN PATENT DOCUMENTS

| | | | |
|---|---|---|---|
| CN | 105103391 | A | 11/2015 |
| CN | 107078452 | A | 8/2017 |
| CN | 107579427 | A | 1/2018 |
| CN | 108141001 | A | 6/2018 |
| CN | 113243064 | A | 8/2021 |
| CN | 113243064 | B | 6/2024 |
| DE | 102016124087 | | 9/2017 |
| DE | 102017107358 | A1 | 10/2018 |
| DE | 102018221363 | A1 | 6/2020 |
| WO | WO 2013/104029 | | 7/2013 |
| WO | WO 2018/015682 | | 1/2018 |
| WO | WO 2018/184943 | | 10/2018 |
| WO | WO 2020/120293 | | 6/2020 |

OTHER PUBLICATIONS

DE Office Action in German Appln. No. 102018221363.1, dated Nov. 11, 2019, 20 pages (with English translation).
Kerse et al., "3.5-GHz intra-burst repetition rate ultrafast Yb-doped fiber laser," Optics Communications, May 1, 2016, 366:404-9.
PCT International Search Report and Written Opinion in International Appln. No. PCT/EP2019/083914, dated Feb. 24, 2020, 25 pages (with English translation).
CN Notice of Allowance and Search Report in Chinese Appln. No. 201980081796.9, mailed on Apr. 1, 2024, 7 pages (with English translation).

* cited by examiner

LASER SYSTEMS AND METHODS FOR PROVIDING HIGH-FREQUENCY AND LOW-FREQUENCY LASER PULSE TRAINS

CROSS REFERENCE TO RELATED APPLICATIONS

This application is a continuation of and claims priority under 35 U.S.C. § 120 from PCT Application No. PCT/EP2019/083914, filed on Dec. 5, 2019, which claims priority from German Application No. 10 2018 221 363.1, filed on Dec. 10, 2018. The entire contents of each of these priority applications are incorporated herein by reference.

TECHNICAL FIELD

The present disclosure relates to laser systems and to methods for operating such a laser system.

BACKGROUND

German Patent Specification DE 10 2016 124 087 B3 discloses a laser system comprising an excitation laser configured for generating laser pulses, an amplifier configured for amplifying laser light, and also a high frequency laser pulse source configured for generating a GHz laser pulse train with an individual pulse repetition rate of individual pulses in the GHz laser pulse train of at least 0.5 GHz, here specifically of at least 1 GHz, in particular more than 5 GHz.

It has been found that surface processing using such GHz laser pulse trains exhibits a very high efficiency and at the same time surface quality, in particular in comparison with processing using low-frequency laser pulse trains at individual pulse repetition rates of less than 0.5 GHz. At the same time, however, processing using low-frequency laser pulse trains also affords advantages, and it may be desirable, in particular, to be able to process a surface using both GHz laser pulse trains and low-frequency laser pulse trains, in particular, to be able to utilize the advantages of both modes. However, known laser systems are designed such that they generate either low-frequency laser pulse trains with individual pulse repetition rates of less than 0.5 GHz or GHz laser pulse trains. Utilization of both modes for processing the same surface is therefore very complex and expensive, because two separate laser systems have to be utilized for this purpose.

SUMMARY

In general, the present disclosure provides laser systems and methods for operating laser systems where the disadvantages mentioned do not occur.

In one aspect, the present disclosure features a laser system including at least one excitation laser, an amplifier, and a high frequency laser pulse source that are configured and arranged in such a way that a beam switchover device is arranged upstream of the amplifier in the light propagation direction, the beam switchover device being switchable between a high-frequency functional position and a low-frequency functional position. In this case, the beam switchover device is configured to feed at least one GHz laser pulse train of the high frequency laser pulse source to the amplifier for amplification in the high-frequency functional position, and to feed at least one low-frequency laser pulse train of the at least one excitation laser with an individual pulse repetition rate of individual laser pulses in the low-frequency laser pulse train of less than 0.5 GHz to the amplifier for amplification in the low-frequency functional position. In this way, it is possible, using one and the same laser system, in a simple and rapid manner, to provide different processing modes, for example, either GHz laser pulse trains or low-frequency laser pulse trains, for processing a surface, where it is possible to switch over between the processing modes, that is to say here between the high-frequency functional position, on one hand, and the low-frequency functional position, on the other hand, in a simple and rapid manner. Optimized surface processing can thus be ensured in a simple and comparatively cost-effective manner.

An excitation laser is understood to mean, for example, a seed laser that can be configured for generating individual laser pulses with a temporal width of a few 100 fs, e.g., approximately 200 fs. The laser system overall can be embodied as an ultrashort pulse (USP) system and in this respect configured to generate laser pulses having a temporal width on the femtoseconds scale or picoseconds scale, for example, of a few 10 fs or a few 10 ps.

The amplifier can be configured for amplifying laser light from the at least one excitation laser and/or from a further laser.

A laser pulse train, which can be a GHz laser pulse train or a low-frequency laser pulse train, is generally understood to mean a sequence of individual laser pulses, also referred to as individual pulses, which succeed one another with a specific individual pulse repetition rate. Such a laser pulse train can be an individual pulse train or a pulse packet.

An individual pulse train is accordingly understood to mean a sequence of individual laser pulses which succeed one another with a specific individual pulse repetition rate, the individual pulses not being grouped into defined pulse packets. If a plurality of individual pulse trains are generated, these individual pulse trains can have, for example, at most randomly an identical temporal spacing, but can have, for example, different temporal spacings with respect to one another. The individual pulse trains are therefore not generated with a specific pulse packet repetition rate.

By contrast, a pulse packet is a group of at least two individual pulses which succeed one another with a specific individual pulse repetition rate, also referred to as micro pulse repetition rate, where a plurality of successive pulse packets succeed one another with a specific pulse packet repetition rate, also referred to as macro pulse repetition rate. The pulse packets thus have a constant temporal spacing with respect to one another.

The prefixes "GHz" and "low-frequency" before the terms "laser pulse train," "individual pulse train," "pulse packet," and "pulse packet repetition rate" refer in each case to the individual pulse repetition rate of the individual pulses, and they indicate here, for example, whether the rate is at least 0.5 GHz ("GHz") or less than 0.5 GHz ("low-frequency").

In some embodiments, the individual pulse repetition rate in the GHz laser pulse train is from at least 1 GHz to at most 100 GHz, e.g., from at least 2 GHz to at most 20 GHz, or to at most 10 GHz, such as 1 GHz, 3.5 GHz, or 5 GHz.

In some embodiments, the laser system is configured to generate a plurality of such GHz laser pulse trains as GHz pulse packets which, for their part, temporally succeed one another with a GHz pulse packet repetition rate of more than one kHz, or in the MHz range, or else of less than one kHz, for example, in the case of high-frequency laser sources having a pulse on demand function. However, the laser pulse trains can also be generated as a sequence without defined pulse packet repetition rate.

The term “light propagation direction” here refers to the direction of propagation of the laser pulses along the laser system, for example, the direction of a Poynting vector of the laser pulses. The light propagation direction refers, for example, to an order in which the laser pulses pass through the individual elements of the laser system. The fact that the beam switchover device is arranged upstream of the amplifier in the light propagation direction thus means, for example, that a laser pulse passes firstly through the beam switchover device and then through the amplifier.

The individual pulse repetition rate with which the individual pulses reach the amplifier or are emitted by the laser system in the low-frequency functional position here is less than 0.5 GHz, for example, from at least 0.01 MHz to at most 100 MHz, or from at least 1 MHz to at most 90 MHz, or from at least 5 MHz to at most 15 MHz, or at most 10 MHz. Consequently, in the laser system there is a distinct separation of the individual pulse repetition rate in the high-frequency functional position, on one hand, and the individual pulse repetition rate in the low-frequency functional position, on the other hand.

The amplifier can be embodied in integral or multipartite fashion. For example, the amplifier can be a main amplifier of the laser system, with at least one preamplifier, e.g., a plurality of preamplifiers, being arranged upstream of the main amplifier in the light propagation direction. In some embodiments, the amplifier can include a plurality of amplifier stages arranged one behind another, that is to say serially, in the light propagation direction. However, the amplifier stages can also additionally or alternatively be arranged in parallel with one another, where the laser pulses can be split upstream of the amplifiers arranged in parallel and be combined with one another again downstream of the amplifiers, for example, by way of polarization coupling or coherent coupling. In some embodiments, a main amplifier is a last amplifier in an amplifier chain including a plurality of amplifiers.

It is possible, in the low-frequency functional position of the beam switchover device, for the laser pulses to be combined to form low-frequency pulse packets (macropulse) with at least two individual pulses in each case, with a repetition rate of the individual pulses (micropulses) within such a low-frequency pulse packet (micropulse repetition rate) of less than 0.5 GHz, for example, from at least 0.01 MHz to at most 100 MHz, or from at least 1 MHz to at most 90 MHz, or from at least 5 MHz to at most 15 MHz, or at most 10 MHz. The low-frequency pulse packets can temporally succeed one another with a low-frequency pulse packet repetition rate (macropulse repetition rate) of a few 100 kHz, a few 10 kHz or a few kHz. Consequently, the low-frequency pulse packets in the low-frequency functional position also differ significantly from the GHz pulse packets in the high-frequency functional position on the basis of the respective individual pulse repetition rate.

In accordance with one embodiment of the present disclosure, the high frequency laser pulse source is embodied as a laser diode. This constitutes a particularly simple configuration of the high frequency laser pulse source. The laser diode can be configured for generating picosecond laser pulses. Such a laser diode can be embodied as a rapidly switchable diode which can generate pulse sequences with an individual pulse repetition rate in the GHz range, such that the laser diode can be used directly as a high frequency laser pulse source.

It is also possible for the high frequency laser pulse source to include a laser diode which does not itself emit laser pulses with an individual pulse repetition rate in the gigahertz range, where a repetition rate multiplier, for example, of the type also explained below or else of some other design, is connected downstream of the laser diode, where in this case the laser diode and the repetition rate multiplier jointly form the high frequency laser pulse source.

Alternatively, it is possible for the high frequency laser pulse source to be embodied as a mode-locked GHz oscillator. As a further alternative, it is possible for the high frequency laser pulse source to be embodied as disclosed in the German Patent Specification DE 10 2016 124 087 B3 for the optical component disclosed therein for generating laser pulses in a burst mode.

Alternatively, it is also possible for both the excitation laser and the high frequency laser pulse source to include a laser diode, for example, to be formed from a laser diode, e.g., from the same laser diode. In some embodiments, the same laser diode that is configured for generating picosecond laser pulses and/or for generating pulse sequences with an individual pulse repetition rate in the GHz range can be used both as excitation laser and as high frequency laser pulse source. In this case, a pulse selection device connected downstream of the laser diode can be used to determine whether the laser system is operated in the high-frequency functional position or in the low-frequency functional position. In some embodiments, by the pulse selection device, which can be embodied as an optical modulator, for example, as an acousto-optical modulator, as an electro-optical modulator, or as a micro-electro-mechanical system, laser pulses can be selectable from the pulse sequence of individual pulses generated by the laser diode, such that depending on the driving of the pulse selection device, laser pulse trains, namely GHz laser pulse trains or low-frequency laser pulse trains, can be generated in each case as individual pulse trains or as pulse packets. The pulse selection device can be arranged upstream or downstream of the amplifier in the light propagation direction. For example, it can be arranged upstream of the amplifier.

In accordance with one embodiment of the present disclosure, the beam switchover device includes at least one beam selector. Alternatively or additionally, the beam switchover device can include at least one beam distributor.

The beam selector can be embodied as a beam changeover switch. In this case a beam changeover switch is understood here to mean a device embodied to select between two sources of laser pulses, beam sources or beam source regions and to guide either laser pulses from one source or laser pulses from the other source in the direction of a target position, for example, identical for all the laser pulses.

However, the beam selector can also be embodied as a passive beam combiner which, for example, depending on the operating state of another element, guides either laser pulses from one source or laser pulses from the other source in the direction of the target position, for example, identical for all the laser pulses.

A beam distributor is understood to mean a device configured to guide a laser beam or laser pulse either along a first beam section or along a second beam section, or to split the laser beam or laser pulse between the first beam section, on one hand, and the second beam section, on the other hand.

In some embodiments, in the laser system, it is sufficient for the beam switchover device to include at least one beam selector embodied as beam changeover switch or to be embodied as a beam changeover switch. This is the case, for example, if a laser diode, a mode-locked GHz oscillator or a GHz source as described in DE 10 2016 124 087 B3 is used as the high frequency laser pulse source—e.g., in addition to the excitation laser. The beam changeover switch can then switch over in a simple manner between the excitation laser, on the one hand, and the high frequency laser pulse source, on the other hand.

However, it can be also possible for the beam switchover device to include both at least one beam distributor and at least one beam selector, where laser pulses originating from the excitation laser can be first split between different beam sections by the beam distributor, where laser pulses originating from the different beam sections, acting as different sources, can be subsequently selected by the beam selector depending on the functional position of the beam distributor and/or of the beam selector and are guided to the target position.

The target position is understood to mean, for example, an element of the laser system, e.g., an optical element, or a processing position, e.g., on a surface processed by the laser system, downstream of the beam selector in the light propagation direction. In some embodiments, the target position can be the amplifier. The target position can be a point or a region of a surface of a workpiece treated by the laser system.

In accordance with another embodiment of the present disclosure, the high frequency laser pulse source is embodied as a repetition rate multiplier. In some embodiments, laser pulses from the excitation laser are able to be fed to the repetition rate multiplier. The repetition rate multiplier is configured to multiply an individual pulse repetition rate of the individual pulses of the excitation laser. In this way, an individual pulse repetition rate in the GHz range can ultimately be generated from the originally comparatively low individual pulse repetition rate of the individual pulses. What is advantageous about the configuration described here is that there is no need for a separate light source, e.g., a separate laser, or a laser diode, for providing the high frequency laser pulse source. Rather, the excitation laser can be used to generate the GHz laser pulse trains, e.g., by laser pulses from the excitation laser being fed to the repetition rate multiplier. In some embodiments, the excitation laser thus serves both for providing low-frequency laser pulse trains in the low-frequency functional position and for providing laser pulses for generating GHz laser pulse trains in the high-frequency functional position, in a manner mediated by way of the repetition rate multiplier.

The repetition rate multiplier can include a beam splitter at an input side, the beam splitter splitting an incoming laser pulse or a laser pulse train between a delay section, on one hand, and a passage section, on the other hand. In this case, the delay section is configured to delay the laser pulse or the laser pulse train relative to the passage section. The delay section and the passage section are configured and coordinated with one another such that the propagation time of the laser pulse or the laser pulse train through the delay section is longer than the propagation time through the passage section. This is realized in a particularly simple manner by the delay section being longer than the passage section, in a particularly simple manner by the passage section and the delay section each being embodied as fiber-optic sections, where a fiber length of the delay section is longer than a fiber length of the passage section. The portion of the light that passes through the delay section is delayed relative to the light which passes through the passage section, such that the laser pulse or the laser pulse train is replicated as a result. The relation between the delay section and the passage section can be configured such that the individual pulse repetition rate of the individual laser pulses is doubled.

Afterward, the laser pulses can be first combined in a combination element, including a beam combiner and a beam splitter, and can then be split again between a further delay section and a further passage section, the laser pulses once again being delayed in the delay section relative to the passage section, as a result of which the individual pulse repetition rate can be doubled once again. This is repeated for a specific number of stations, each station being assigned a factor of two in the individual pulse repetition rate. It is possible for the repetition rate multiplier to be embodied as described, e.g., in C. Kerse et al., 3,5-GHz intra-burst repetition rate ultrafast Yb-doped fiber laser, Opt. Commun. 366 (2016), 404-409, for example, with respect to FIG. 1(*b*) there. Here the length of the delay section is halved from station to station, with an identical length of the passage section. In this case, an individual pulse train is delayed by half a temporal individual pulse spacing in a station of the repetition rate multiplier, such that the delayed individual pulse train and the non-delayed individual pulse train, in a superimposed fashion, are intermeshed virtually in a comb-like manner.

Alternatively, it is possible for the repetition rate multiplier to be embodied as disclosed, e.g., in the Patent Specification DE 10 2016 124 087 B3. In this case, the length of the delay section is doubled from station to station, with an identical passage section. Here an entire group of individual laser pulses is always delayed by the group length of the group, such that the number of individual laser pulses in the group—and thus, for example, at the same time also the group itself—is ultimately doubled in each case. The individual pulse repetition rate results here from the first delay of an individual pulse in the first station of the repetition rate multiplier. In this case, the individual pulse repetition rate is the reciprocal of the delay time realized there.

The repetition rate multiplier can be embodied as a fiber-optic repetition rate multiplier. In some embodiments, both the delay sections and the passage sections are embodied as fiber-optic components.

In accordance with another embodiment of the present disclosure, the beam switchover device includes a beam distributor configured to split laser light of the excitation laser temporally and/or spatially between the repetition rate multiplier, on one hand, and an individual pulse section, on the other hand. The laser pulses of the excitation laser are thus used both for providing the low-frequency laser pulse trains and for generating the GHz laser pulse trains in the repetition rate multiplier, such that there is no need for an additional laser. In this case, temporal splitting means, for example, that individual laser pulses are fed either to the individual pulse section or to the repetition rate multiplier in a time-dependent manner, for example, depending on the instantaneous functional position of the laser system. Spatial splitting means, for example, that individual laser pulses are split and guided in different spatial directions, for example, by a passive beam splitter that splits the individual laser pulses between a first and a second spatial direction with a constant splitting ratio, or by an active beam switching device that guides the individual laser pulses in the first spatial direction or in the second spatial direction depending on the functional position of the laser system.

The beam switchover device can additionally include the beam selector, which can be embodied as an active beam changeover switch or as a passive beam combiner.

The beam selector can be configured to feed to the amplifier at least one GHz laser pulse train from the repetition rate multiplier in the high-frequency functional position and laser pulses from the individual pulse section in the low-frequency functional position.

Accordingly, the functional position of the laser system can be set by driving of the beam distributor and/or of the beam selector, for example, of the beam changeover switch. The beam section of the laser system, thus the individual pulse section or the repetition rate multiplier, from which light is guided to the target position is selected through the choice of the functional position of the beam distributor and/or of the beam selector. It is thus possible to switch between the high-frequency functional position and the low-frequency functional position in a simple manner by the beam switchover device.

In accordance with another embodiment of the present disclosure, the beam distributor is embodied as a passive beam splitter, for example, with a constant splitting ratio. In some examples, the splitting ratio can be 20:80, where 20% of the light power is guided in a first spatial direction, where 80% of the light power is guided in a second spatial direction, different than the first spatial direction. In some examples, the beam splitter is configured and arranged such that 80% of the light power is fed to the repetition rate multiplier, where 20% of the light power is fed to the individual pulse section. This advantageously takes account of the fact that the repetition rate multiplier includes a larger number of optical components than the individual pulse section, such that power losses in the repetition rate multiplier are higher than along the individual pulse section. The 20:80 splitting refers to the light power of an individual pulse that is forwarded by the beam splitter. It goes without saying that losses also occur in the beam splitter itself. The corresponding losses can be compensated for, for example, over compensated for, downstream of the repetition rate multiplier, on one hand, and downstream of the individual pulse section, on the other hand, in the light propagation direction by way of the amplifier and/or at least one preamplifier.

Alternatively, it is provided that the beam distributor can be embodied as an active beam switching device. In this way—depending on the functional position of the laser system and depending on the switching position of the active beam switching device—laser pulses can be fed either to the individual pulse section or to the repetition rate multiplier. The active beam switching device can be switched synchronously with and in the same sense as the beam selector if the latter is embodied as an active beam changeover switch.

Alternatively, it is also possible for the beam distributor to be embodied from a combination of a passive beam splitter and an active beam switching device. In this way, too, the laser light of the excitation laser can be split temporally and/or spatially between the repetition rate multiplier, on one hand, and the individual pulse section, on the other hand.

In accordance with another embodiment of the present disclosure, the beam selector is embodied as an active beam switching device. It is thus possible to switch over between the high-frequency functional position and the low-frequency functional position in a particularly simple manner in particular using a single optical component.

Alternatively, it is possible for the beam selector to be embodied as a combination of a passive beam combiner with at least one active beam influencing device. In this case, a beam combiner is understood to mean an optical element configured to combine at least two laser beams incident from different sources or beam sections to form one laser beam. The beam combiner can be, for example, a beam splitter arranged inversely in the light propagation direction, the function of this component being reversed depending on its orientation relative to the light propagation direction. The active beam influencing device is configured for optional deflection and/or attenuation of the laser beam and is arranged in at least one beam section of the laser system, selected from the repetition rate multiplier, on one hand, and the individual pulse section, on the other hand, optionally to transmit light in said beam section without being reduced—if appropriate apart from unavoidable losses—or else to deflect or attenuate light. In this way, the corresponding beam section can as it were be switched on or off by the active beam influencing device, depending on the functional position of the active beam influencing device. In some embodiments, a respective active beam influencing device is arranged in each beam section, that is to say in the repetition rate multiplier and in the individual pulse section. In this way, optionally in each case one of the beam sections can be switched on and the other beam section can be switched off, depending on the functional position of the laser system.

The active beam influencing device can be embodied in a particularly simple manner as a switchable, for example, foldable, tiltable or rotatable mirror that either transmits the laser beam in the direction of the passive beam combiner or else deflects it away from the beam combiner, for example, into a beam dump. However, the beam influencing device can also be embodied as an acousto-optical modulator, an electro-optical modulator, or a micro-electro-mechanical system, or in some other suitable manner.

In the two cases mentioned above where the beam selector is embodied either as an active beam switching device or as a combination of a passive beam combiner with at least one active beam influencing device, the beam selector is embodied as a beam changeover switch, that is to say, for example, as an actively switchable element having, for example, two functional positions.

In accordance with another embodiment of the present disclosure, the beam selector is embodied as a passive beam combiner. The beam selector can be configured particularly simply in this way. This configuration is possible, for example, if the beam distributor is embodied as an active beam switching device or as a combination of a passive beam splitter and an active beam switching device, thus overall as an active element which is switchable into different functional positions. It becomes clear here that ultimately only one actively switchable element is needed, either on the part of the beam distributor or on the part of the beam selector, to switch over between the different functional positions of the laser system. Nevertheless, it is also possible for both the beam distributor and the beam selector to be active elements, which can be then switched synchronously with and, for example, in the same sense as one another to switch over between the high-frequency functional position and the low-frequency functional position.

In accordance with one embodiment, for example, the beam switchover device can include as beam distributor a passive beam splitter for splitting laser light between the individual pulse section, on one hand, and the repetition rate multiplier, on the other hand, and as beam selector an active beam switching device for optionally forwarding laser light from the individual pulse section or the repetition rate multiplier to the target position.

In accordance with another embodiment, the beam switchover device can include an active beam switching device both as beam distributor and as beam selector.

In accordance with another embodiment, the beam switchover device can include a combination of a passive beam splitter and an active beam switching device as beam distributor, and an active beam switching device as beam selector.

In accordance with another embodiment, the beam switchover device can include a passive beam splitter as beam distributor and a combination of a passive beam combiner with at least one active beam influencing device as beam selector.

In accordance with another embodiment, the beam switchover device can include an active beam splitter as beam distributor and a combination of a passive beam combiner with at least one active beam influencing device as beam selector.

In accordance with another embodiment, the beam switchover device can include a combination of a passive beam splitter and an active beam switching device as beam distributor, and a combination of a passive beam combiner with at least one active beam influencing device as beam selector.

In accordance with another embodiment, the beam switchover device can include an active beam switching device as beam distributor and a passive beam combiner as beam selector.

In accordance with another embodiment, the beam switchover device can include a combination of a passive beam splitter and an active beam switching device as beam distributor, and a passive beam combiner as beam selector.

In accordance with another embodiment of the present disclosure, the beam switchover device includes at least one active beam switching device, where the active beam switching device is embodied as an acousto-optical modulator, as an electro-optical modulator, or as a micro-electro-mechanical system. In some embodiments, in the text above, here and below an active beam switching device can be understood to mean an acousto-optical modulator, an electro-optical modulator, or a micro-electro-mechanical system. These elements can be suitable for bringing about active beam switching. However, the active beam switching device can also be embodied in a particularly simple manner as a switchable, for example, foldable, tiltable or rotatable mirror, or include such a switchable, for example, foldable, tiltable or rotatable mirror.

In accordance with another embodiment of the present disclosure, the laser system includes a mode change device, which for its part includes the beam distributor, the repetition rate multiplier, the individual pulse section, and the beam selector. In some embodiments, the mode change device includes the beam distributor, the repetition rate multiplier, the individual pulse section, and the beam selector. However, it is also possible for the mode change device to include additional, further components.

In accordance with one configuration, the mode change device is arranged upstream of a pulse selection device in the light propagation direction, where the pulse selection device is configured for selecting individual pulses or individual laser pulse trains. With the aid of the pulse selection device, the number and/or rate of laser pulses or laser pulse trains actually impinging on the target position, for example, a surface to be processed, can be varied as desired by virtue of not every individual pulse or every laser pulse train being transmitted to the target position, but rather only selected individual pulses or laser pulse trains. For example, by the pulse selection device, low-frequency pulse packets with a defined low-frequency pulse packet repetition rate or GHz pulse packets with a defined GHz pulse packet repetition rate can also be generated from individual pulses.

The pulse selection device can be arranged upstream of the amplifier and/or upstream of a preamplifier. In this case, the pulse selection device can also be used to prevent an excessively high light power from being applied to these components.

The pulse selection device can additionally be used to control the amplitude of the emerging laser light of the laser system.

An arrangement of the mode change device upstream of the pulse selection device has the advantage that a particularly good setting of the amplitude of the emerging laser light for the laser system is possible.

Alternatively or additionally, it is possible for the mode change device to be arranged upstream of a first preamplifier of the laser system. This is advantageous since only comparatively low light power is applied to the mode change device and the latter is treated with care in this respect.

Alternatively or additionally, it is provided that the mode change device can be arranged upstream of a pulse stretcher of the laser system. In this case, the pulse stretcher serves to temporally stretch an individual laser pulse of the excitation laser and thus to enable the further modification of the laser pulse for the employed components without damage. In some embodiments, amplification in the amplifier and optionally at least one preamplifier can be possible without damage for the components if a laser pulse generated by the excitation laser is first stretched by the pulse stretcher. If the mode change device and thus, for example, the repetition rate multiplier are arranged upstream of the pulse stretcher, the latter sees short laser pulses that can optionally have a high peak pulse power, such that a small output signal, that is to say a small pulse power, of the excitation laser is advantageously employed.

Alternatively or additionally, it is provided that the mode change device can be arranged downstream of the first preamplifier.

Alternatively or additionally, it is possible for the mode change device to be arranged downstream of the pulse selection device. In this case, a GHz laser pulse train having very steep edges, but in return little signal, is generated from individual selected laser pulses by the repetition rate multiplier.

In some embodiments, it is also possible for the mode change device to be arranged downstream of the pulse stretcher and upstream of the pulse selection device. In this case, the mode change device acquires relatively much signal, although with the use of a comparatively slow, but in return cost-effective and reliable pulse selection device, such as an acousto-optical modulator, for example, the laser pulse trains generated can be temporally shaped on account of the stretched individual pulses, thus giving rise to flat edges. The edges of an envelope of the laser pulse trains can be flattened. This is not critical if laser pulse trains of sufficient temporal length are generated. Alternatively, however, it is also possible to use a fast modulator, in particular an electro-optical modulator, as pulse selection device.

In accordance with another embodiment of the present disclosure, the laser system includes downstream of the excitation laser in the light propagation direction—for example, in the order indicated—a pulse stretcher, a first preamplifier, optionally a second preamplifier, the amplifier, and a pulse compressor. In this case, the laser pulses emitted by the excitation laser can be temporally stretched in the pulse stretcher, preamplified in the first preamplifier and optionally the second preamplifier, amplified in the amplifier, and finally in turn temporally compressed in the pulse compressor in order to obtain intensive laser pulses which are temporally short, for example, with a length of less than 50 ps, e.g., less than 400 fs, and have a high power density. In this case, for example, at least the first preamplifier, if appropriate the second preamplifier, and the amplifier are embodied as fiber-optic components. In some embodiments, the excitation laser is also a fiber laser. The pulse stretcher, too, can be embodied as a fiber-optic component. The pulse compressor can be not embodied as a fiber-optic component, rather within the pulse compressor and downstream of the pulse compressor in the light propagation direction the laser pulses are propagated outside by fibers, for example, in a vacuum, air, or a gas, since power densities that could otherwise result in the destruction, for example, of fiber-optic components are attained here.

In accordance with one configuration, the mode change device can be arranged downstream of the excitation laser and upstream of the pulse stretcher. In accordance with another configuration, the mode change device can be arranged downstream of the pulse stretcher and upstream of the first preamplifier. In accordance with another configuration, the mode change device can be arranged downstream of the first preamplifier and upstream of the amplifier.

In some embodiments, the laser system additionally includes the pulse selection device. The latter can be arranged downstream of the pulse stretcher and upstream of the first preamplifier in accordance with one configuration, downstream of the first preamplifier and upstream of the amplifier in accordance with another configuration, downstream of the first preamplifier and upstream of the second preamplifier in accordance with another configuration, and downstream of the second preamplifier and upstream of the amplifier in accordance with a further configuration.

The mode change device can be arranged in each case directly upstream or directly downstream of the pulse selection device, but it is also possible for the mode change device and the pulse selection device not to be arranged in direct succession.

In accordance with a further configuration, the laser system can include an additional, second pulse selection device, which is arranged downstream of the amplifier in the light propagation direction. By the second pulse selection device, too, low-frequency pulse packets with a defined low-frequency pulse packet repetition rate or GHz pulse packets with a defined GHz pulse packet repetition rate can be generated in particular from individual pulses.

If the pulse selection device is arranged downstream of the first preamplifier, the capacity of the latter can be better utilized since more laser pulses reach it compared with when it is arranged downstream of the pulse selection device.

In accordance with another embodiment of the present disclosure, the excitation laser is embodied as a fiber oscillator. This constitutes a particularly suitable configuration of the excitation laser, in particular in combination with further fiber-optic components of the laser system.

In accordance with certain embodiments of the present disclosure, the laser system can include a control device configured for driving the beam switchover device. With the aid of the control device, it is thus possible optionally to switch between the high-frequency functional position and the low-frequency functional position.

In another aspect, the present disclosure features methods for operating a laser system, for example, a laser system according to the present disclosure or a laser system according to any of the embodiments described above, where a beam switchover device of the laser system is optionally switched into a high-frequency functional position and a low-frequency functional position in order in the high-frequency functional position to guide at least one GHz laser pulse train with an individual pulse repetition rate of individual pulses in the GHz laser pulse train of at least 0.5 GHz from a high frequency laser pulse source to a target position, and in the low-frequency functional position to guide at least one low-frequency laser pulse train with an individual pulse repetition rate of individual laser pulses in the low-frequency laser pulse train of less than 0.5 GHz from at least one excitation laser to the target position. The advantages that have already been described in association with the laser system can be realized in association with the method.

In the context of the method it is not absolutely necessary for the beam switchover device to be arranged upstream of an amplifier. Rather, it is also possible for the beam switchover device to be arranged downstream of the amplifier in the light propagation direction, where already amplified laser pulses of the high frequency laser pulse source, on one hand, and of the excitation laser, on the other hand, can be then fed as individual pulse trains or pulse packets to the beam switchover device. For the rest, however, in this embodiment, too, the laser system operated in the context of the method can be configured in the manner as has been described above in association with the laser system according to the present disclosure and the configurations or embodiments thereof.

In another aspect, the present disclosure features a laser system including a high frequency laser pulse source, an excitation laser and a beam switchover device, where the laser system is configured for carrying out a method according to the present disclosure or a method according to any of the embodiments described above. The advantages that have already been explained in association with the method can be thus afforded in association with the laser system.

As already explained with regard to the method, in the case of this laser system it is not absolutely necessary for the beam switchover device to be arranged upstream of an amplifier in the light propagation direction, rather the beam switchover device can also be arranged downstream of an amplifier, where already amplified laser pulses from the high frequency laser pulse source, on one hand, and the excitation laser, on the other hand, are then fed to the beam switchover device. In some embodiments, the laser system includes two amplifiers, namely an amplifier assigned to the high frequency laser pulse source and an amplifier assigned to an individual pulse section, where at least the individual pulse section is fed with laser pulses from the excitation laser.

The high frequency laser pulse source can include a separate laser for generating laser pulses, for example, a laser diode. However, it is possible for the high frequency laser pulse source also to be fed with laser pulses from the excitation laser. In this respect, the high frequency laser pulse source can be embodied as a repetition rate multiplier, in particular with an assigned amplifier.

Moreover, it is possible for both the high frequency laser pulse source and the excitation laser to include a laser diode, for example, to consist of a laser diode, where a configuration in which one and the same laser diode forms both the high frequency laser pulse source and the excitation laser is also possible. With a pulse selection device, individual pulses generated by the laser diode can then be subjected to clock reduction with regard to their individual pulse repetition rate, and/or be trimmed with respect to GHz pulse packets or low-frequency pulse packets. All functional positions and functional modes of the laser system described above are thus producible by the laser diode and the pulse selection device. The laser diode can be configured for generating picosecond laser pulses, where it can be embodied as a rapidly switchable diode that can generate pulse sequences with an individual pulse repetition rate in the GHz range. The laser diode can then be used in particular directly as a high frequency laser pulse source.

Further advantages and advantageous configurations of the subject matter of the present disclosure are evident from the description, the claims and the drawing. Likewise, the features mentioned above and those presented further below can each be used by themselves or as a plurality in any desired combinations. The embodiments shown and described should not be understood as an exhaustive enumeration, but rather are of example character for outlining the present disclosure.

DETAILED DESCRIPTION

Figure 1:
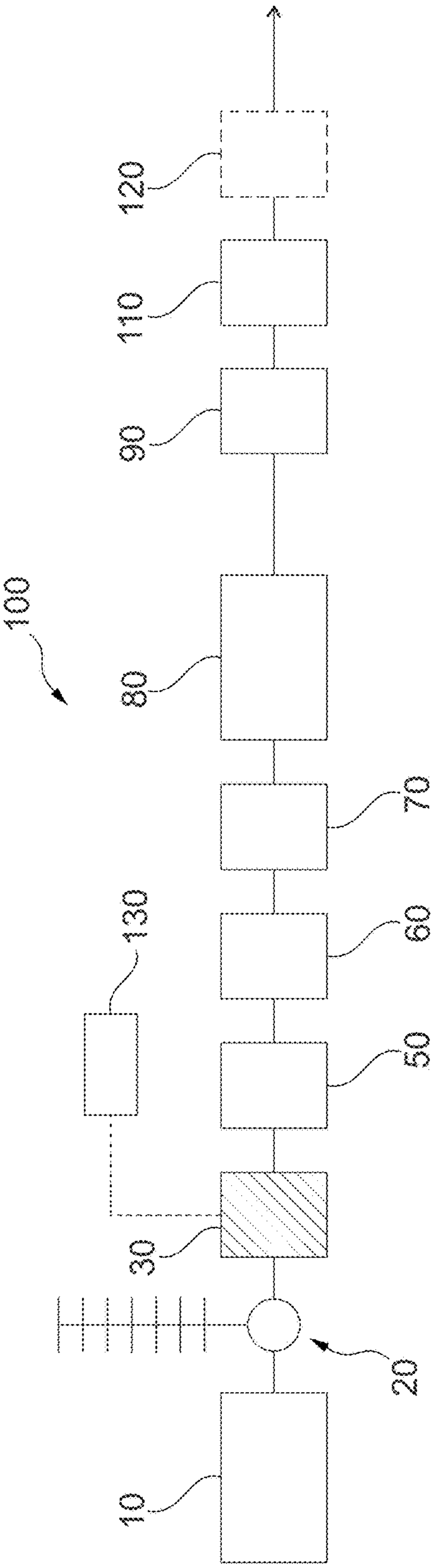
FIG. 1 is a schematic illustration of a first example of an embodiment of a laser system, as described herein.
Figure 2:
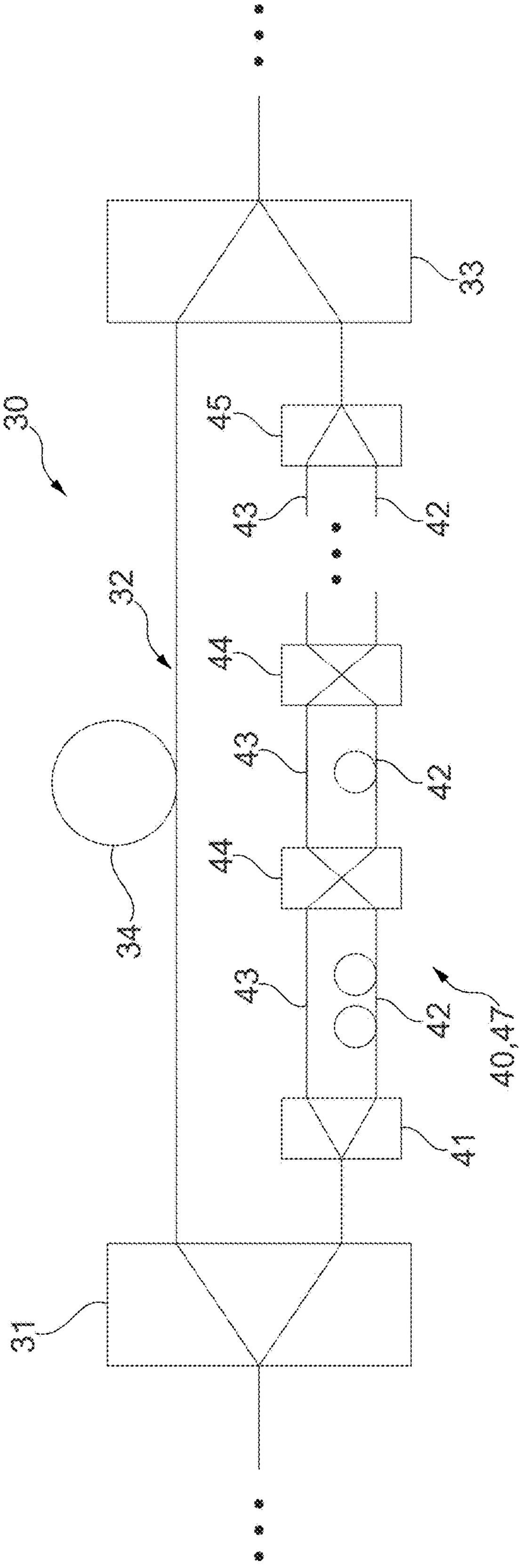
FIG. 2 is a schematic illustration of an example of an embodiment of a mode change device as described herein.

FIG. 1 shows a schematic illustration of a first embodiment of a laser system 100. The laser system 100 includes an excitation laser 10 configured for generating laser pulses, e.g., with an individual pulse repetition rate of less than 0.5 GHz, of from at least 0.01 MHz to at most 100 MHz, of from at least 1 MHz to at most 90 MHz, or of from at least 5 MHz to at most 15 MHz or at most 10 MHz. The excitation laser 10 can be a fiber laser or a diode laser or any other suitable excitation laser. The laser system 100 also includes an amplifier 80 configured for amplifying laser light. The amplifier 80 can be a fiber amplifier, a rod amplifier, a slab amplifier, a disk amplifier, a solid state amplifier, or any other suitable laser amplifier. The laser system 100 additionally includes a high frequency laser pulse source 40, which is illustrated in FIG. 2 and which is part of a mode change device 30 in the embodiment in accordance with FIG. 1. The high frequency laser pulse source 40 is configured for generating a GHz laser pulse train with an individual pulse repetition rate in the GHz laser pulse train of at least 0.5 GHz, e.g., of from at least 1 GHz to at most 100 GHz, or of from at least 2 GHz to at most 10 GHz, such as 3.5 GHz or 5 GHz.

Abeam switchover device 31, 33, which is likewise illustrated in FIG. 2 and which is likewise part of the mode change device 30 here in the embodiment in accordance with FIG. 1, is arranged upstream of the amplifier 80 in the light propagation direction. The beam switchover device 31, 33 is switchable between a high-frequency functional position and a low-frequency functional position and is configured to feed at least one GHz laser pulse train of the high frequency laser pulse source 40, e.g., a plurality of GHz laser pulse trains, to the amplifier 80 for amplification in the high-frequency functional position, and to feed at least one low-frequency laser pulse train of the at least one excitation laser 10, e.g., a plurality of low-frequency laser pulse trains, with an individual pulse repetition rate of individual laser pulses in the low-frequency laser pulse train of less than 0.5 GHz to the amplifier 80 for amplification in the low-frequency functional position. In the case of the laser system 100, as described herein, it is thus advantageously possible to switch over between the generation of GHz laser pulse trains, on one hand, and the generation of low-frequency laser pulse trains, on the other hand, and thus to provide a plurality of processing modes for processing workpieces, e.g., workpiece surfaces, in a simple and comparatively cost-effective manner.

The laser system 100 in accordance with the first embodiment in FIG. 1 can additionally include, downstream of the excitation laser 10 in the light propagation direction, a pulse stretcher 20, the mode change device 30, a first preamplifier 50, a second preamplifier 70, the amplifier 80, and a pulse compressor 110. Each of the first preamplifier 50 and the second preamplifier 70 can be a fiber preamplifier, rod preamplifier or any other suitable preamplifier.

The laser system 100 can additionally include a pulse selection device (or pulse selector) 60, which can be arranged between the first preamplifier 50 and the second preamplifier 70, as illustrated in FIG. 1. Furthermore, the laser system 100 can include a further, second pulse selection device (or pulse selector) 90, which can be arranged downstream of the amplifier 80 and upstream of the pulse compressor 110.

With the aid of at least one of the pulse selection devices 60, 90, in the low-frequency functional position it is possible to generate low-frequency pulse packets having at least two individual pulses and an individual pulse repetition rate of the individual pulses (micropulses) within such a low-frequency pulse packet (micropulse repetition rate) of less than 0.5 GHz, e.g., of from at least 0.01 MHz to at most 100 MHz, or from at least 1 MHz to at most 90 MHz, or of from at least 5 MHz to at most 15 MHz, or at most 10 MHz. The low-frequency pulse packets can temporally succeed one another with a low-frequency pulse packet repetition rate (macropulse repetition rate) of a few 100 kHz, a few 10 kHz or a few kHz.

With the aid of at least one of the pulse selection devices 60, 90, the GHz laser pulse trains can also be trimmed as GHz pulse packets having an individual pulse repetition rate of at least 0.5 GHz, e.g., of more than 0.5 GHz, or of from at least 1 GHz to at most 100 GHz, or of from at least 2 GHz to at most 20 GHz, or to at most 10 GHz, such as 1 GHz, 3.5 GHz or 5 GHz. The GHz pulse packets can succeed one another with a GHz pulse packet repetition rate (macropulse repetition rate) which can be more than 1 kHz or lies in the MHz range, where the GHz pulse packet repetition rate can also be less than 1 kHz.

It is also possible, however, to generate the laser pulse trains, whether they be GHz or low-frequency laser pulse trains, as individual pulse trains without a defined pulse packet repetition rate.

In some embodiments, it is possible to arrange downstream of the pulse compressor 110 one or more nonlinear optical components 120 configured for frequency conversion of the laser light of the excitation laser 10, e.g., for frequency multiplication, for example, frequency doubling or frequency tripling, for example, for generating a second harmonic of the excitation wavelength. The nonlinear optical components 120 can include frequency conversion crystals, e.g., Beta Barum Borate (BBO) or Lithium Triborate (LBO) crystals, or any other suitable type of crystals or elements for frequency multiplication.

In addition, the laser system 100 can include a control device (or controller) 130 configured for driving the beam switchover device 31, 33 to switch over from the high-frequency functional position to the low-frequency functional position—or vice versa.

The excitation laser 10 can be embodied as a fiber oscillator.

In the first embodiment illustrated here, the mode change device 30 is arranged upstream of the pulse selection device 60 and also upstream of the first preamplifier 50 and upstream of the second preamplifier 70. In some cases, the mode change device 30 is arranged directly downstream of the pulse stretcher 20 and upstream of the first preamplifier 50.

FIG. 2 shows an embodiment of the mode change device 30. The mode change device can include the beam switchover device 31, 33, which for its part includes a beam selector 33, embodied here as a beam changeover switch, and also a beam distributor 31. In this case, the beam distributor 31 is configured to split a laser beam or laser pulse between two beam sections, e.g., between the high frequency laser pulse source 40, on one hand, and an individual pulse section 32, on the other hand. The beam selector 33 is configured to guide laser light or laser pulses from the two beam sections onto a common path, e.g., to a common target position.

The high frequency laser pulse source 40 can be embodied here as a repetition rate multiplier 47, where laser pulses from the excitation laser 10 are able to be fed to the repetition rate multiplier 47. The repetition rate multiplier 47 is configured to multiply an individual pulse repetition rate of the individual pulses of the excitation laser 10.

The mode change device 30 can include the beam distributor 31, the repetition rate multiplier 47, the individual pulse section 32 and the beam selector 33.

The beam distributor 31 is configured here to split laser light of the excitation laser 10 temporally and/or spatially between the repetition rate multiplier 47, on one hand, and the individual pulse section 32, on the other hand. The beam selector 33 is configured to feed to the amplifier 80 at least one GHz laser pulse train from the repetition rate multiplier 47 in the high-frequency functional position, and laser pulses from the individual pulse section 32 in the low-frequency functional position.

In some embodiments, the beam distributor 31 is embodied as a passive beam splitter, e.g., with a constant splitting ratio. Alternatively, the beam distributor 31 can also be embodied as an active beam switching device, e.g., as an acousto-optical modulator, as an electro-optical modulator, or as a micro-electro-mechanical system.

Finally, it is also possible for the beam distributor 31 to be embodied as a combination of a passive beam splitter and an active beam switching device.

The beam selector 33 can be embodied as an active beam switching device, e.g., as an acousto-optical modulator, as an electro-optical modulator, or as a micro-electro-mechanical system. Alternatively, it is also possible for the beam selector 33 to be embodied as a combination of a passive beam combiner with at least one active beam influencing device, e.g., with a respective active beam influencing device of each beam section, that is to say here in the individual pulse section 32, on one hand, and the repetition rate multiplier 47, on the other hand.

If the beam selector 33 is not embodied as an active beam changeover switch, then it can alternatively also be embodied as a passive beam combiner. This is possible in particular if the beam distributor 31 is embodied as an active beam switching device or as a combination of a passive beam splitter and an active beam switching device.

Both the individual pulse section 32 and the repetition rate multiplier 47 can be embodied as fiber-optic components or include fiber-optic components. The individual pulse section 32 can include an individual pulse delay section 34 for compensating for dispersion.

On the input side, the repetition rate multiplier 47 includes a multiplier beam splitter 41, which splits the incoming laser pulses between a delay section 42, on one hand, and a passage section 43, on the other hand. In this case, the delay section 42 has a longer light path than the passage section 43, such that the laser pulse passing through the delay section 42 is delayed relative to the laser pulse passing through the passage section 43.

The repetition rate multiplier 47 additionally includes a plurality of combination elements 44, which each combine a beam combiner and a beam splitter with one another, where here in each case the laser radiation from the passage section 43, on one hand, and the delay section 42, on the other hand, is firstly combined with one another and then once again split between a downstream delay section 42 and a downstream passage section 43. This can be repeated as often as desired, in principle, where successive delay sections 42 can each have, depending on the configuration of the repetition rate multiplier 47, a doubling or—as in the embodiment illustrated here—halving length, such that as a result either laser pulse trains passing through the repetition rate multiplier 47 are multiplied or—as in the embodiment illustrated here—the individual pulse repetition rate is multiplied, namely by a factor of 2 per delay section passed through. On the output side, the repetition rate multiplier 47 includes a multiplier beam combiner 45, which combines the laser radiation from a last passage section 43 with the laser radiation from a last delay section 42 and forwards the combined laser radiation as a GHz laser pulse train to the beam selector 33.

Figure 3:
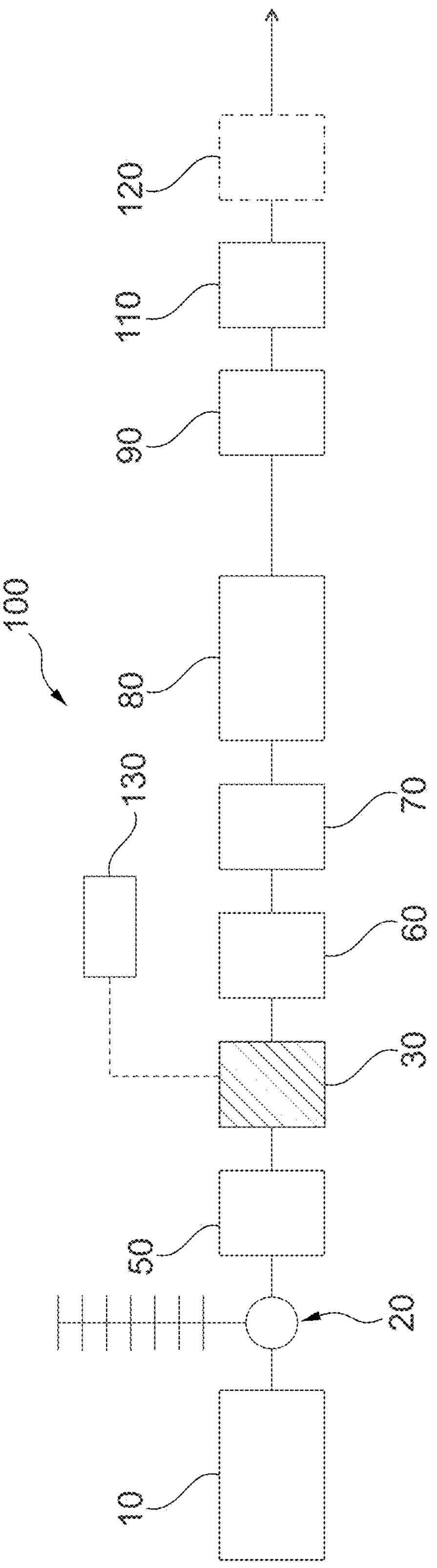
FIG. 3 is a schematic illustration of a second embodiment of the laser system.

FIG. 3 shows a schematic illustration of a second embodiment of the laser system 100.

Identical and functionally identical elements are always provided with identical reference signs in all of the figures, and so in this respect reference is made in each case to the preceding description.

The second embodiment in accordance with FIG. 3 differs from the first embodiment in accordance with FIG. 1 insofar as here the mode change device 30 is arranged downstream of the first preamplifier 50, here, for example, directly downstream of the first preamplifier 50 and directly upstream of the pulse selection device 60. Moreover, it is arranged upstream of the second preamplifier 70.

In the embodiments in accordance with FIGS. 1 and 3, the mode change device 30 is arranged in each case downstream of the pulse stretcher 20 and upstream of the pulse selection device 60. In this case, there is relatively much signal, but with the use of a slow pulse selection device 60 such as an acousto-optical modulator, for example, the problem arises that the GHz laser pulse trains generated by the high frequency laser pulse source 40 can be temporally shaped by the pulse selection device 60, giving rise to flat edges. This is not critical with GHz laser pulse trains of sufficient temporal length. Furthermore, it is not critical if a fast modulator such as an electro-optical modulator, for example, is used as the pulse selection device 60.

Figure 4:
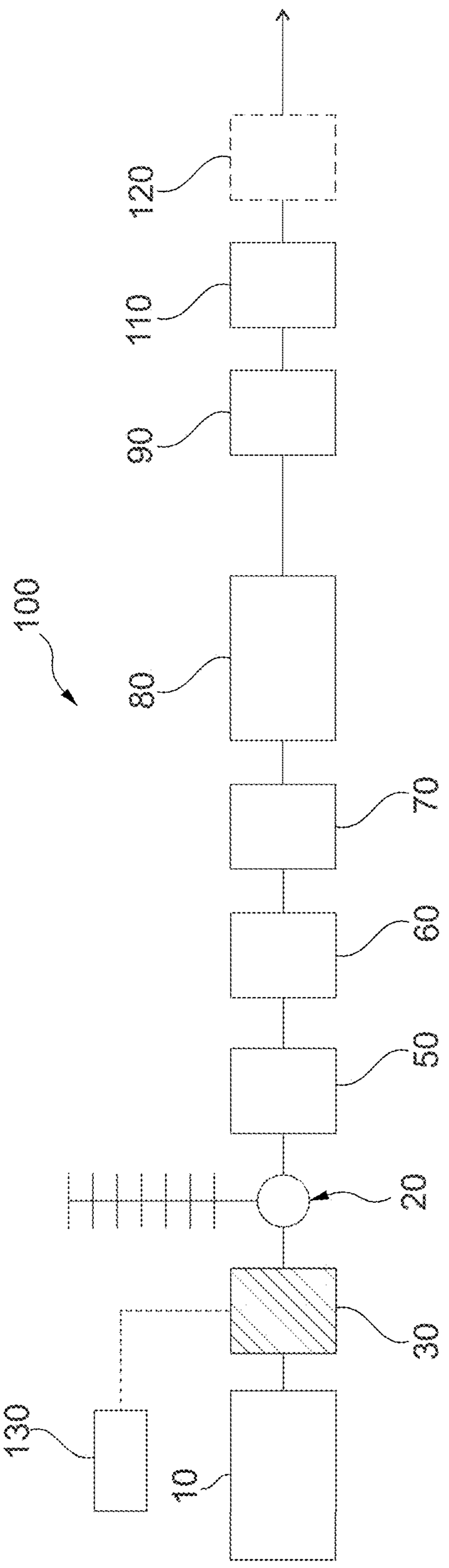
FIG. 4 shows a schematic illustration of a third embodiment of the laser system.

FIG. 4 shows a schematic illustration of a third embodiment of the laser system 100. In this case, the mode change device 30 is arranged upstream of the pulse stretcher 20, for example, directly upstream of the pulse stretcher 20. In this case, the high frequency laser pulse source 40, e.g., the repetition rate multiplier 47, can generate short pulses that may possibly have an excessively high peak pulse power, and so a small signal of the excitation laser 10 can be advantageously employed.

Figure 5:
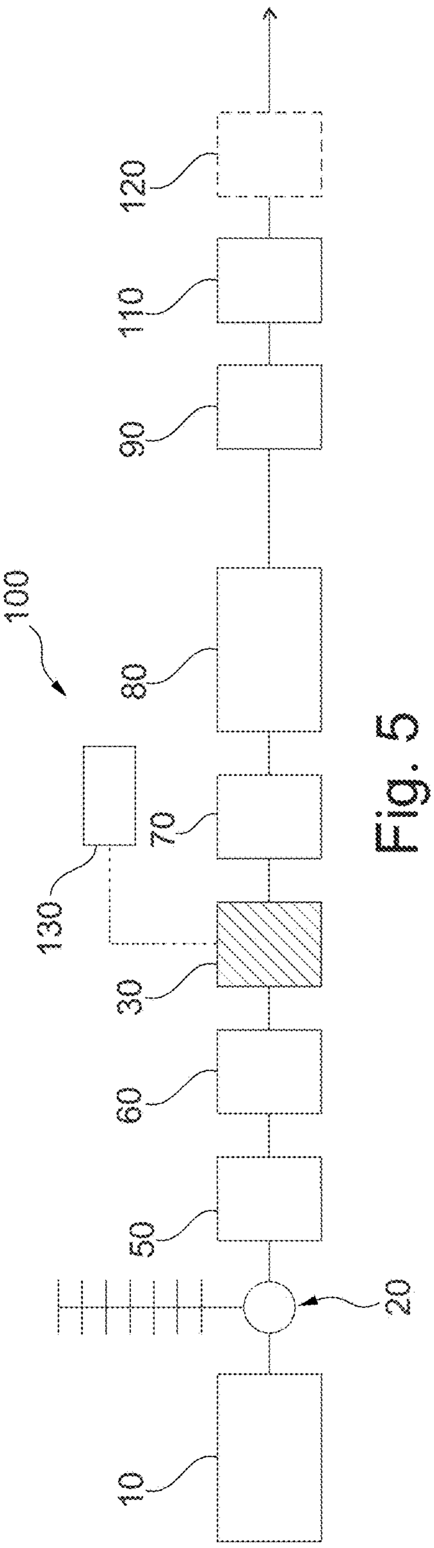
FIG. 5 shows a schematic illustration of a fourth embodiment of the laser system.

FIG. 5 shows a schematic illustration of a fourth embodiment of the laser system 100. In this case, the mode change device 30 is arranged downstream of the pulse selection device 60, for example, directly downstream of the pulse selection device 60, and, for example, directly upstream of the second preamplifier 70 in the light propagation direction. The arrangement downstream of the pulse selection device 60 has the advantage that a GHz laser pulse train having very steep edges, but in return less signal, can be generated from a single laser pulse.

Alternatively, it is also possible, in a manner not illustrated here, for the mode change device 30 to be arranged downstream of the second preamplifier 70, for example, directly downstream of the second preamplifier 70, e.g., upstream of the amplifier 80, for example, directly upstream of the amplifier 80.

Figure 6:
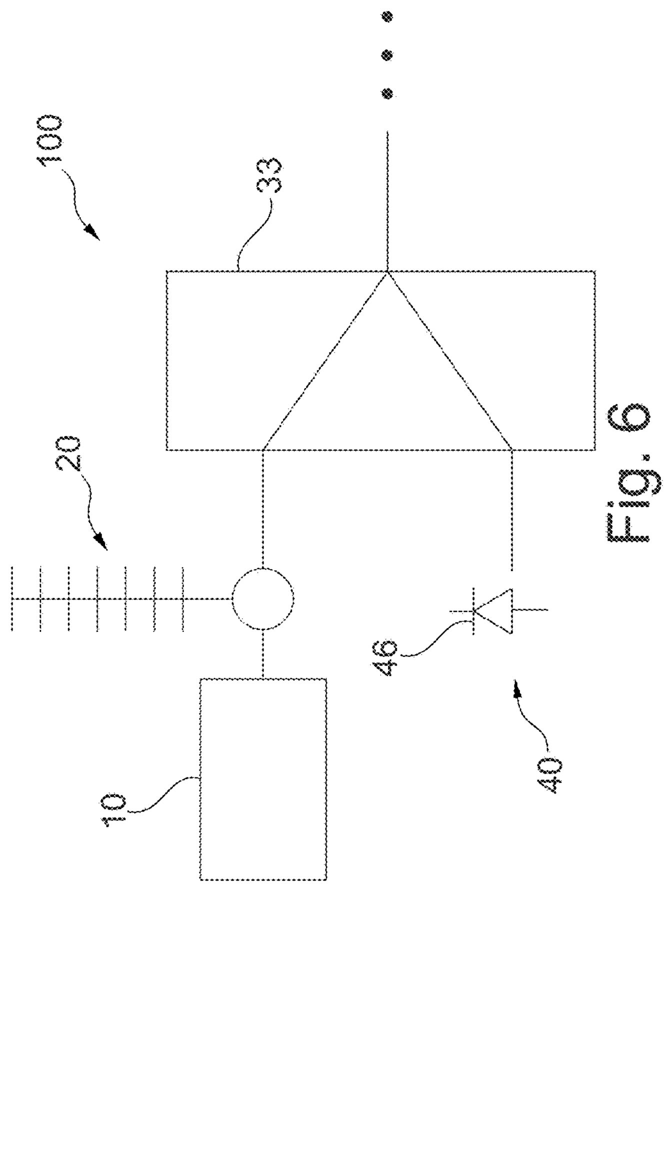
FIG. 6 shows a schematic illustration of a fifth embodiment of the laser system.

FIG. 6 shows a schematic illustration of a fifth embodiment of the laser system 100. In this case, the high frequency laser pulse source 40 is configured as a laser diode 46, which can be configured for generating picosecond pulses. For example, the laser diode 46 can be configured to generate laser pulses with an individual pulse repetition rate in the GHz range. However, it is also possible to combine the laser diode 46 with a diode repetition rate multiplier assigned thereto.

In this embodiment, the beam switchover device 31, 33 can include only the beam selector 33, which is embodied as a beam changeover switch and which here can receive light on one hand from the excitation laser 10 and the pulse stretcher 20 and on the other hand from the laser diode 46—optionally combined with a diode repetition rate multiplier. This light is fed to a common further light path. In the latter there then follow, in a configuration, the first preamplifier 50, the pulse selection device 60, the second preamplifier 70, the amplifier 80, for example, the second pulse selection device 90, the pulse compressor 110, and if appropriate—optionally—the at least one nonlinear optical component 120, if appropriate in this or any other suitable order.

Figure 7:
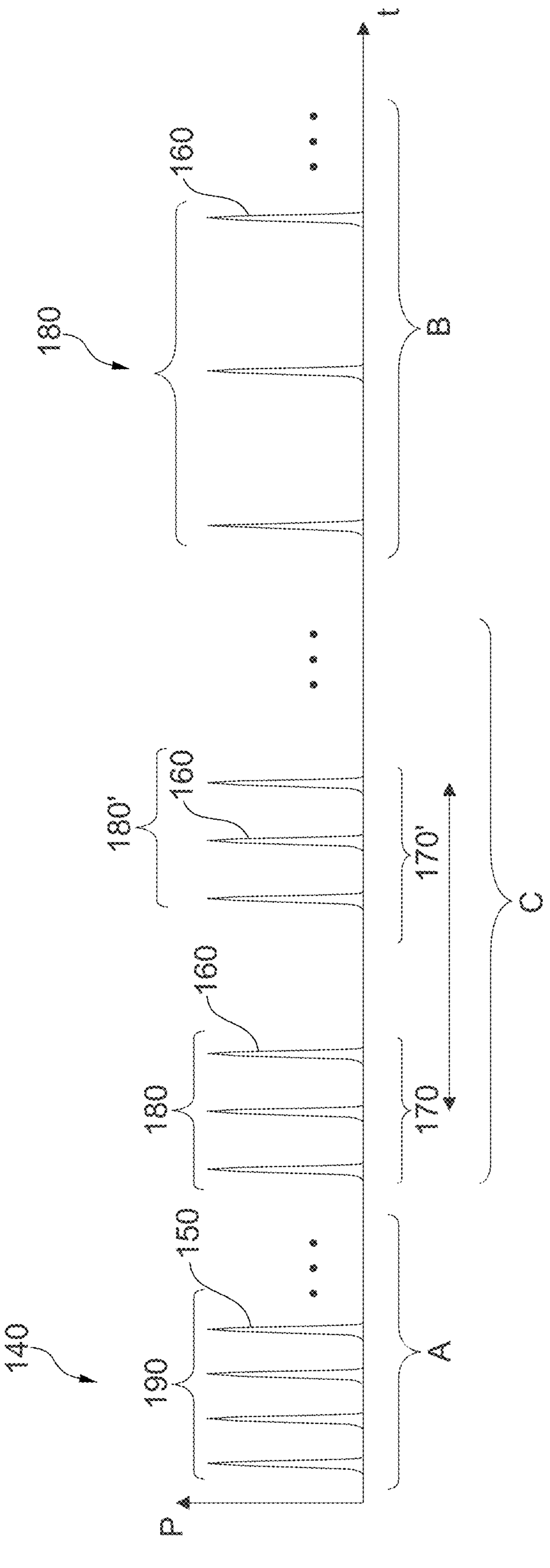
FIG. 7 shows a schematic illustration of a functional mode of a laser system according to the present disclosure.

FIG. 7 shows a schematic illustration of a functional mode of the laser system 100.

In this case, here an instantaneous laser power P, for example, on the output side of the laser system 100 is plotted against time t in a diagram. In this case, an operating mode of the laser system 100 in the high-frequency functional position of the beam switchover device 31, 33 is illustrated at A. In this case, GHz laser pulse trains 140 are generated, where here a GHz individual pulse train 190 is illustrated by way of example here. The GHz individual pulse train 190 includes individual pulses 150 which succeed one another with an individual pulse repetition rate of at least 0.5 GHz within the GHz laser pulse train 140. In some examples, a plurality of such GHz laser pulse trains 140 can be generated as GHz pulse packets which in turn succeed one another with a GHz pulse packet repetition rate of more than one kHz, or else in the MHz range.

A first configuration of an operating mode of the laser system 100 in the low-frequency functional position of the beam switchover device 31, 33 is illustrated at B, where here at least one low-frequency laser pulse train 180 having individual laser pulses 160 with an individual pulse repetition rate of less than 0.5 GHz, for example, with an individual pulse repetition rate of a few kHz, or else in the MHz range, is generated as a low-frequency individual pulse train.

A second configuration of the operating mode of the laser system 100 in the low-frequency functional position is illustrated at C, where two low-frequency laser pulse trains 180, 180' are illustrated, and where here the laser pulses 160 are combined to form low-frequency pulse packets 170, 170', of which a first low-frequency pulse packet 170 and a second low-frequency pulse packet 170' are illustrated here. An individual pulse repetition rate of the individual laser pulses within the low-frequency pulse packets 170, 170' can be from at least 0.01 MHz to at most 100 MHz, or from at least 1 MHz to at most 90 MHz, or from at least 5 MHz to at most 15 MHz, or at most 10 MHz. The low-frequency pulse packets 170, 170' can temporally succeed one another with a low-frequency pulse packet repetition rate of a few kHz, a few 10 kHz or a few 100 kHz.

A method for operating the laser system 100 can include: the beam switchover device 31 33 of the laser system 100 is optionally switched into the high-frequency functional position or into the low-frequency functional position to guide at least one GHz laser pulse train 140 with an individual pulse repetition rate of individual pulses 150 in the GHz laser pulse train 140 of at least 0.5 GHz from the high frequency laser pulse source 40 to a target position in the high-frequency functional position, and to guide at least one low-frequency laser pulse train 180, 180' with an individual pulse repetition rate of less than 0.5 GHz from the excitation laser 10 to the target position in the low-frequency functional position.

In this respect, a laser system 100 can also include the high frequency laser pulse source 40, the excitation laser 10 and the beam switchover device 31, 33 and which is configured for carrying out such a method.

OTHER EMBODIMENTS

A number of embodiments of the present disclosure have been described. Nevertheless, it will be understood that various modifications may be made without departing from the spirit and scope of the present disclosure. Accordingly, other embodiments are within the scope of the following claims.

What is claimed is:

1. A laser system, comprising:

an excitation laser configured to generate laser pulses in a low-frequency laser pulse train with a pulse repetition rate of individual pulses in the low-frequency laser pulse train of less than 0.5 GHz and at least 0.01 MHz;

a high frequency laser pulse source configured to generate a GHz laser pulse train with a pulse repetition rate of individual pulses in the GHz laser pulse train of at least 0.5 GHz and at most 100 GHz, wherein the high frequency laser pulse source comprises a repetition rate multiplier;

an amplifier configured to amplify laser light; and a beam switchover device arranged upstream of the amplifier in a light propagation direction, wherein the beam switchover device is switchable between a high-frequency functional position and a low-frequency functional position, and wherein the beam switchover device comprises:

a beam distributor configured to split laser light of the excitation laser temporally or spatially or both temporally and spatially between two beam sections comprising a section of the high frequency laser pulse source and an individual pulse section, and a beam selector configured to: a) feed to the amplifier at least one GHz laser pulse train from the section of the high frequency laser pulse source for amplification in the high-frequency functional position and b) feed to the amplifier laser pulses from the individual pulse section for amplification in the low-frequency functional position.

2. The laser system of claim 1, wherein the repetition rate multiplier is configured to:

receive a plurality of individual laser pulses from the excitation laser; and multiply an individual pulse repetition rate of the plurality of individual laser pulses.

3. The laser system of claim 1, wherein the beam distributor comprises:

a) a passive beam splitter, b) an active beam switching device, or c) a combination of a passive beam splitter and an active beam switching device.

4. The laser system of claim 1, wherein the beam selector comprises:

a) an active beam switching device, b) a passive beam combiner, or c) a combination of a passive beam combiner and at least one active beam switching device.

5. The laser system of claim 1, wherein the beam switchover device is arranged, in the light propagation direction, one of:

a) upstream of a pulse selection device for selecting individual pulses or individual laser pulse trains, b) upstream of a preamplifier, c) upstream of a pulse stretcher, d) downstream of the preamplifier, or e) downstream of the pulse selection device.

6. The laser system of claim 1, wherein the beam switchover device comprises one of a) an acousto-optical modulator, b) an electro-optical modulator, or c) a micro-electro-mechanical system.

7. The laser system of claim 1, wherein, downstream of the excitation laser in the light propagation direction, the laser system further comprises at least one of:

a) a pulse stretcher;

b) at least one preamplifier;

c) the amplifier; or d) a pulse compressor.

8. The laser system of claim 1, wherein the excitation laser comprises a fiber oscillator.

9. The laser system of claim 1, further comprising a controller configured to drive the beam switchover device.

10. A method of operating a laser system, the method comprising:

generating, by an excitation laser of the laser system, laser pulses in a low-frequency laser pulse train with a pulse repetition rate of individual pulses in the low-frequency laser pulse train of less than 0.5 GHz and at least 0.01 MHz;

generating, by a high frequency laser pulse source of the laser system, a GHz laser pulse train with a pulse repetition rate of individual pulses in the GHz laser pulse train of at least 0.5 GHz and at most 100 GHz, wherein the high frequency laser pulse source comprises a repetition rate multiplier;

switching a beam switchover device of the laser system into a high-frequency functional position to guide at least one GHz laser pulse train from the high frequency laser pulse source to a target position, wherein the beam switchover device comprises a beam distributor configured to split laser light of the excitation laser temporally or spatially or both temporally and spatially between two beam sections comprising a section of the high frequency laser pulse source and an individual pulse section; and switching the beam switchover device into a low-frequency functional position to guide at least one low-frequency laser pulse train from the excitation laser to the target position, wherein switching the beam switchover device into the high-frequency functional position and the low-frequency functional position is in order, and wherein the beam switchover device further comprises a beam selector configured to: a) feed to the target position the at least one GHz laser pulse train from the section of the high frequency laser pulse source in the high-frequency functional position, and b) feed to the target position the at least one low-frequency laser pulse train from the individual pulse section in the low-frequency functional position.

11. A laser system, comprising:

an excitation laser configured to generate laser pulses in a low-frequency laser pulse train with a pulse repetition rate of individual pulses in the low-frequency laser pulse train of less than 0.5 GHz and at least 0.01 MHz;

a high frequency laser pulse source configured to generate a GHz laser pulse train with a pulse repetition rate of individual pulses in the GHz laser pulse train of at least 0.5 GHz and at most 100 GHz, wherein the high frequency laser pulse source comprises a repetition rate multiplier;

an amplifier configured to amplify laser light; and a beam switchover device configured to be switched:

a) in a high-frequency functional position to guide at least one GHz laser pulse train from the high frequency laser pulse source to a target position, and b) in a low-frequency functional position to guide at least one low-frequency laser pulse train from the excitation laser to the target position, wherein the beam switchover device is configured to be switched in order in the high-frequency functional position and the low-frequency functional position, and wherein the beam switchover device comprises:

a beam distributor configured to split laser light of the excitation laser temporally or spatially or both temporally and spatially between two beam sections comprising a section of the high frequency laser pulse source and an individual pulse section, and a beam selector configured to: a) feed to target position at least one GHz laser pulse train from the section of the high frequency laser pulse source in the high-frequency functional position, and b) feed to the target position the at least one low-frequency laser pulse train from the individual pulse section in the low-frequency functional position.

12. The laser system of claim 11, wherein the beam switchover device is arranged upstream of the amplifier in a light propagation direction, and the amplifier is at the target position.

13. The laser system of claim 11, wherein the repetition rate multiplier is configured to:

receive a plurality of individual laser pulses from the excitation laser; and multiply an individual pulse repetition rate of the plurality of individual laser pulses.

14. The laser system of claim 1, wherein the beam distributor comprises an active beam switching device, and the beam selector comprises a passive beam combiner.

* * * * *